United States Patent
Lee et al.

(10) Patent No.: US 10,297,778 B2
(45) Date of Patent: May 21, 2019

(54) LIGHT-EMITTING DEVICE

(71) Applicant: Samsung Electronics Co., Ltd., Suwon-si, Gyeonggi-do (KR)

(72) Inventors: Sunghun Lee, Hwaseong-si (KR); Jiwhan Kim, Seoul (KR); Sungjun Kim, Seongnam-si (KR); Sukekazu Aratani, Hwaseong-si (KR); Hyeonho Choi, Seoul (KR); Seungyeon Kwak, Suwon-si (KR); Hyun Koo, Seongnam-si (KR); Sangdong Kim, Seoul (KR); Seokhwan Hong, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/913,130

(22) Filed: Mar. 6, 2018

(65) Prior Publication Data
US 2018/0254425 A1     Sep. 6, 2018

(30) Foreign Application Priority Data

Mar. 6, 2017    (KR) .................. 10-2017-0028548

(51) Int. Cl.
*H01L 51/50* (2006.01)
*H01L 51/52* (2006.01)

(52) U.S. Cl.
CPC ...... *H01L 51/5016* (2013.01); *H01L 51/5024* (2013.01); *H01L 51/5056* (2013.01);
(Continued)

(58) Field of Classification Search
CPC ............. H01L 51/5016; H01L 51/5024; H01L 51/5056; H01L 51/5072; H01L 51/5092;
(Continued)

(56) References Cited

U.S. PATENT DOCUMENTS

| | | | |
|---|---|---|---|
| 6,515,298 B2 | 2/2003 | Forrest et al. | |
| 7,034,454 B2* | 4/2006 | Kawai ................... | C09K 11/06 313/504 |

(Continued)

FOREIGN PATENT DOCUMENTS

JP    2016-025209 A    2/2016

OTHER PUBLICATIONS

Hironori Kaji et al. "Purely organic electroluminescent material realizing 100% conversion from electricity to light", Nature Communications, 2015, 6:8476 (8 pp.).

(Continued)

*Primary Examiner* — Ida M Soward
(74) *Attorney, Agent, or Firm* — Cantor Colburn LLP

(57) ABSTRACT

A light-emitting device including an material, wherein $K_{ISC}/K_{FL(original)}$ of the emitting material is about 100 or greater, $K_{RISC}/K_{PH(original)}$ of the emitting material is about 100 or greater, $K_{ISC}/K_{RISC}$ of the emitting material is about 0.9 or greater and about 1,000 or less, wherein, among all emission components of the emitting material, a ratio of a phosphorescent emission component that is emitted by a radiative transition of a triple exciton to a ground state is 90% or greater, wherein the $K_{ISC}$, the $K_{RISC}$, the $K_{FL(original)}$, the $K_{PH(original)}$ are the same as described in the specification, and wherein the ratio of the phosphorescent emission component are evaluated from a transient photoluminescence (PL) spectrum per temperature of the emitting material.

20 Claims, 7 Drawing Sheets

(52) U.S. Cl.
CPC ...... *H01L 51/5072* (2013.01); *H01L 51/5092* (2013.01); *H01L 51/5096* (2013.01); *H01L 51/5218* (2013.01); *H01L 51/5221* (2013.01)

(58) Field of Classification Search
CPC ............. H01L 51/5096; H01L 51/5218; H01L 51/5221
See application file for complete search history.

(56) References Cited

U.S. PATENT DOCUMENTS

| | | | |
|---|---|---|---|
| 8,580,579 B2 | 11/2013 | Hell et al. | |
| 2008/0048571 A1* | 2/2008 | Yoon | B82Y 20/00 315/169.3 |
| 2011/0297234 A1* | 12/2011 | Forrest | H01L 51/0055 136/263 |
| 2013/0264518 A1 | 10/2013 | Yersin | |
| 2014/0226692 A1* | 8/2014 | Forrest | H01S 5/36 372/45.01 |
| 2015/0155500 A1* | 6/2015 | Yersin | H01L 51/0072 252/500 |
| 2015/0274762 A1 | 10/2015 | Li et al. | |
| 2015/0311449 A1* | 10/2015 | Yeh | H01L 51/0072 257/40 |
| 2016/0293866 A1* | 10/2016 | Ishibashi | C09K 11/06 |
| 2017/0025629 A1* | 1/2017 | Helander | H01L 51/5004 |
| 2017/0163010 A1* | 6/2017 | Nakanotani | C07D 487/14 |
| 2018/0175306 A1* | 6/2018 | Dyatkin | H01L 51/0072 |

OTHER PUBLICATIONS

Tyler B. Fleetham et al. "Tetradentate Pt(II) complexes with 6-membered chelate rings: A new route for stable and efficient blue OLEDs", Chemistry of Materials, DOI: 10.1021/acs.chemmater.5b04957 (2016), 10 pp.

Yumi Sakai et al. "Zinc complexes exhibiting highly efficient thermally activated delayed fluorescence and their application to organic light-emitting diodes", Chem. Commun. 2015, 51, 3181-3184 (4 pp.).

Zhi-Qiang Zhu et al. "Harvesting All Electrogenerated Excitons through Metal Assisted Delayed Fluorescent Materials", Adv. Mater. 2015, 27, 2533-2537.

* cited by examiner

LIGHT-EMITTING DEVICE

CROSS-REFERENCE TO RELATED APPLICATION

This application claims priority to Korean Patent Application No. 10-2017-0028548, filed on Mar. 6, 2017, in the Korean Intellectual Property Office, and all the benefits accruing therefrom under 35 U.S.C. § 119, the content of which is incorporated herein in its entirety by reference.

BACKGROUND

1. Field

The present disclosure relates to a light-emitting device.

2. Description of the Related Art

Organic light-emitting devices (OLEDs) are self-emission devices that have wide viewing angles, high contrast ratios, short response times, and excellent brightness, driving voltage, and response speed characteristics, compared to devices in the art, and that produce full-color images.

A typical organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons transit from an excited state to a ground state, thereby generating light.

Various types of organic light emitting devices are known. However, there still remains a need in OLEDs having low driving voltage, high efficiency, high brightness, and long lifespan.

SUMMARY

Provided is a light-emitting device having high light-emitting efficiency, a long lifespan, and a low roll-off ratio due to the inclusion therein of an emitting material that satisfies predetermined conditions.

Additional aspects will be set forth in part in the description which follows and, in part, will be apparent from the description, or may be learned by practice of the presented embodiments.

According to an aspect of an embodiment, a light-emitting device includes an emitting material, wherein $K_{ISC}/K_{FL(original)}$ of the emitting material is about 100 or greater, $K_{RISC}/K_{PH(original)}$ of the emitting material is about 100 or greater, $K_{ISC}/K_{RISC}$ of the emitting material is about 0.9 or greater and about 1,000 or less, wherein, among all emission components of the emitting material, a ratio of a phosphorescent emission component that is emitted by a radiative transition of a triple exciton to a ground state is 90% or greater, wherein the $K_{ISC}$ is an intersystem crossing rate of the emitting material from a lowest excited singlet ($S_1$) energy level to a lowest excited triplet ($T_1$) energy level, wherein the $K_{RISC}$ is a reverse intersystem crossing rate of the emitting material from a $T_1$ energy level to an $S_1$ energy level, wherein the $K_{FL(original)}$ is a radiative transition rate of a singlet exciton of the emitting material from an $S_1$ energy level to a ground state under a system in which intercrossing of excitons of the emitting material is assumed not to occur between the singlet energy level of the emitting material and the triplet energy level of the emitting material, wherein the $K_{PH(original)}$ is a radiative transition rate of the triplet exciton of the emitting material from a $T_1$ energy level to a ground state under a system in which intercrossing of excitons of the emitting material is assumed not to occur between the singlet energy level of the emitting material and the triplet energy level of the emitting material, and wherein the $K_{ISC}$, the $K_{RISC}$, the $K_{FL(original)}$, the $K_{PH(original)}$, and the ratio of the phosphorescent emission component are evaluated from a transient photoluminescence (PL) spectrum per temperature of the emitting material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
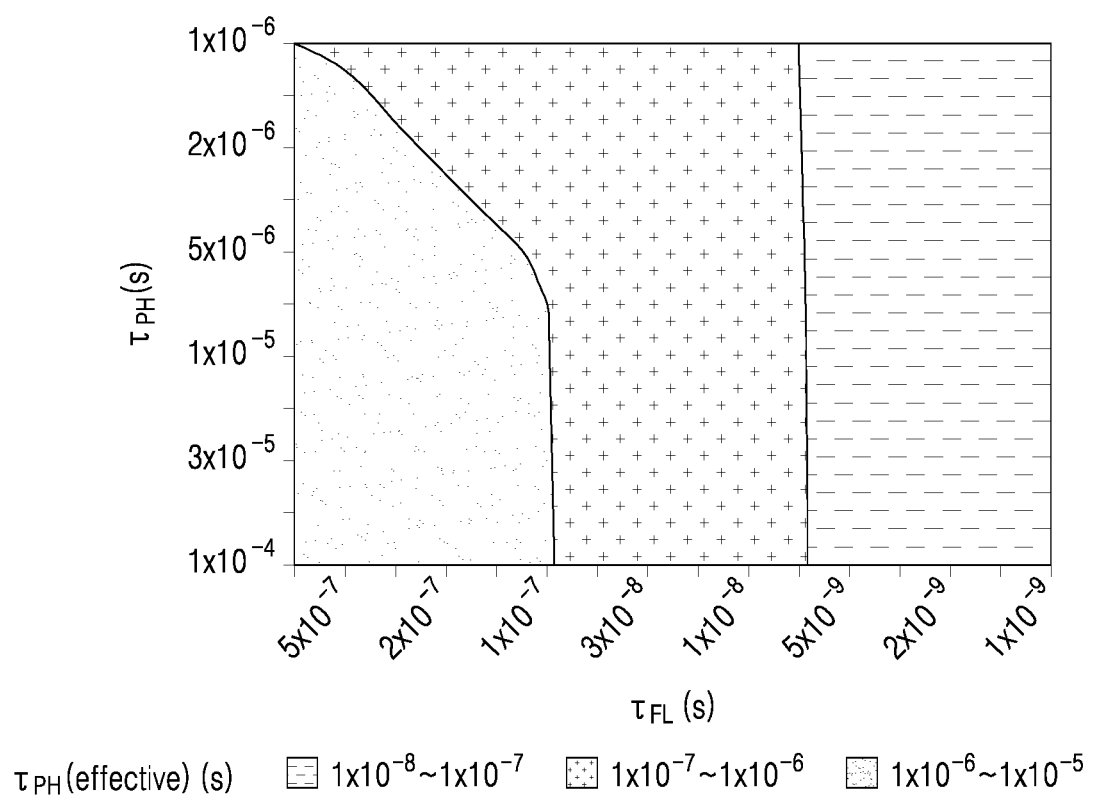
FIGS. 1 to 6 each is a graph of $\tau_{PH}$ (seconds, s) versus $\tau_{FL}$ (seconds, s), illustrating $\tau_{PH(effective)}$ (seconds, s) values according to $K_{PH(original)}$ (reverse seconds, s$^{-1}$) (x-axis) and $K_{FL(original)}$ (reverse seconds, s$^{-1}$) (y-axis) of an emitting material having $K_{ISC}/K_{RISC}$ that is 10, 50, 100, 500, 1,000, or 5,000, respectively.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section dis- cussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, a light-emitting device is provided. The light-emitting device according to an embodiment includes an emitting material.

$K_{ISC}/K_{FL(original)}$ and $K_{RISC}/K_{PH(original)}$ of the emitting material may each independently be about 100 or greater or, for example, about 150 or greater. In some embodiments, $K_{ISC}/K_{FL(original)}$ and $K_{RISC}/K_{PH(original)}$ of the emitting material may each independently be in a range of about 100 or greater and to about 500 or less or, for example, about 150 or greater and about 300 or less, but embodiments are not limited thereto.

Also, $K_{ISC}/K_{RISC}$ of the emitting material may be about 0.9 or greater and about 1,000 or less, for example, about 10 or greater and about 1,000 or less, or, for example, about 10 or greater and about 500 or less. In some embodiments, $K_{ISC}/K_{RISC}$ of the emitting material may be about 10 or greater and about 50 or less, but embodiments are not limited thereto.

Here, 1) $K_{ISC}$ is an intersystem crossing rate of the emitting material from a lowest excited singlet ($S_1$) energy level to a lowest excited triplet ($T_1$) energy level, 2) $K_{RISC}$ is a reverse intersystem crossing rate of the emitting material from a $T_1$ energy level to an $S_1$ energy level, 3) $K_{FL(original)}$ is a radiative transition rate of a singlet exciton of the emitting material from an $S_1$ energy level to a ground state under a system in which intercrossing of excitons of the emitting material is assumed not to occur between the singlet energy level of the emitting material and the triplet energy level of the emitting material, and 4) $K_{PH(original)}$ is a radiative transition rate of a triplet exciton of the emitting material from a $T_1$ energy level to a ground state under a system in which intercrossing of excitons of the emitting material is assumed not to occur between the singlet energy level of the emitting material and the triplet energy level of the emitting material.

$K_{FL(original)}$ of the emitting material is about $1 \times 10^7$ reverse seconds ($s^{-1}$) or greater, or, for example, about $2 \times 10^8$ $s^{-1}$ or greater, or, for example, about $1 \times 10^7$ $s^{-1}$ or greater and about $1 \times 10^{10}$ $s^{-1}$ or less, but embodiments are not limited thereto. In some embodiments, $K_{FL(original)}$ of the emitting material may be about $2 \times 10^8$ $s^{-1}$ or greater and about $1 \times 10^{10}$ $s^{-1}$ or less, but embodiments are not limited thereto.

$K_{PH(original)}$ of the emitting material may be about $1 \times 10^4$ $s^{-1}$ or greater, or, for example, about $1 \times 10^4$ $s^{-1}$ or greater and about $1 \times 10^7$ $s^{-1}$ or less, but embodiments are not limited thereto.

$K_{ISC}$, $K_{RISC}$, $K_{FL(original)}$, and $K_{PH(original)}$ may be evaluated (measured) from a transient PL spectrum per temperature of the emitting material. A transient PL spectrum per temperature measurement technique of the emitting material may be easily understood by those of ordinary skill in the art.

Among all emission components of the emitting material, a ratio of a phosphorescent emission component that is emitted by a radiative transition of the triple exciton to a ground state may be about 90% or greater, for example, about 92% or greater, or, for example, about 94% or greater.

In some embodiments, a ratio of the phosphorescent emission component among all emission components of the emitting material may be about 96% or greater, or, for example, about 98% or greater, but embodiments are not limited thereto.

The emitting material has the ratio of a phosphorescent emission component described above and thus may be classified as "a phosphorescent emitting material". Therefore, the emitting material is clearly distinguished from "a fluorescent emitting material", wherein, among all emission components of the emitting material, a ratio of a fluorescent emission component that is emitted by a radiative transition of a singlet exciton to a ground state, is about 50% or greater (for example, about 70% or greater).

A ratio (%) of the phosphorescent emission component of the emitting material may be evaluated (measured) from a transient PL spectrum per temperature of the emitting material.

As described above, when $K_{ISC}/K_{FL(original)}$ and $K_{RISC}/K_{PH(original)}$ of the emitting material are each independently about 100 or greater (that is, when each of $K_{ISC}$ and $K_{RISC}$ is significantly greater than each of $K_{FL(original)}$ and $K_{PH(original)}$, respectively), a ratio of a radiative transition of a triplet exciton of the emitting material from a $T_1$ energy level to a ground state and a ratio of radiative transition of a singlet exciton of the emitting material from an $S_1$ energy level to a ground state under a steady state system in which intercrossing of excitons of the emitting material between the singlet energy level and the triplet energy level occurs at rates of $K_{ISC}$ and $K_{RISC}$, may be determined by $K_{ISC}$ and $K_{RISC}$ of the emitting material.

That is, $R_{PH}$, which is a ratio of a phosphorescent emission component that is emitted by a radiative transition of a triplet exciton to a ground state, with respect to all emission components emitted from the emitting material, may be calculated by $K_{ISC}$ and $K_{RISC}$ of the emitting material as defined according to Equation 1:

$$R_{PH}=K_{ISC}/(K_{RISC}+K_{ISC}) \quad \text{Equation 1}$$

In some embodiments, $R_{PH}$ of the emitting material may be about 0.9 or greater and less than about 1, or, for example, about 0.94 or greater and less than about 1. In some embodiments, $R_{PH}$ of the emitting material may be about 0.96 or greater and less than about 1, or, for example, about 0.98 or greater and less than about 1.

While not wishing to be bound by theory, it is understood that when $R_{PH}$ of the emitting material satisfies these ranges above, all excitons (triplet excitons: 75%, singlet excitons: 25%) formed by charges injected from an electrode can contribute to emitting light, and thus a light-emitting device including the emitting material may have high efficiency.

While not wishing to be bound by theory, it is understood that when both $K_{ISC}/K_{FL(original)}$ and $K_{RISC}/K_{PH(original)}$ of the emitting material are each independently about 100 or greater (that is, when each of $K_{ISC}$ and $K_{RISC}$ is significantly greater than each of $K_{FL(original)}$ and $K_{PH(original)}$, respectively), the triplet excitons that occupy 75% (a theoretical value) among 100% of the total excitons become a main source of the singlet excitons, and thus $K_{PH(effective)}$ and $K_{FL(effective)}$ of the emitting material may substantially become the same.

Here, 1) $K_{PH(effective)}$ is a radiative transition rate of the triplet exciton of the emitting material from a $T_1$ energy level to a ground state under a steady state system in which intercrossing of excitons of the emitting material between the singlet energy level of the emitting material and the triplet energy level of the emitting material occurs at rates of $K_{ISC}$ and $K_{RISC}$, and 2) $K_{FL(effective)}$ is a radiative transition rate of a singlet exciton of the emitting material from an $S_1$ energy level to a ground state under a steady state system in which intercrossing of excitons of the emitting material between the singlet energy level of the emitting material and the triplet energy level of the emitting material occurs at rates of $K_{ISC}$ and $K_{RISC}$.

That is, $K_{PH(effective)}$ and $K_{FL(effective)}$ of the emitting material are the same and may be defined according to Equation 2:

$$K_{PH(effective)}=K_{FL(effective)}=R_{PH}\times K_{PH(original)}+(1-R_{PH})\times K_{FL(original)} \quad \text{Equation 2}$$

In Equation 2, $R_{PH}$ is a value calculated by Equation 1 used herein which is $K_{ISC}/(K_{RISC}+K_{ISC})$.

Since $K_{ISC}/K_{RISC}$ of the emitting material is in a range of about 0.9 or greater and about 1,000 or less as described above, $K_{PH(effective)}$ and $K_{FL(effective)}$ defined according to Equation 2 may be selected from a range of about $1\times10^6$ s$^{-1}$ to about $1\times10^9$ s$^{-1}$, or, for example, about $1\times10^6$ s$^{-1}$ to about $1\times10^8$ s$^{-1}$.

As a result, $\tau_{PH(effective)}$ of the emitting material may be selected from a range of about $1\times10^{-9}$ seconds (s) to about $1\times10^{-6}$ s, or, for example, about $1\times10^{-8}$ s to about $0.9\times10^{-6}$ s. Also, $\tau_{PH(effective)}$ of the emitting material may be selected from a range of about $1\times10^{-8}$ s to about $1\times10^{-7}$ s, but embodiments are not limited thereto.

Here, $\tau_{PH(effective)}$ is a decay time for radiative transition of a triplet exciton of the emitting material from a $T_1$ energy level to a ground state under a steady state system in which intercrossing of excitons of the emitting material between the singlet energy level of the emitting material and the triplet energy level of the emitting material occurs at rates of $K_{ISC}$ and $K_{RISC}$, and $\tau_{PH(effective)}$ is evaluated (measured) from a room-temperature transient PL spectrum of the emitting material.

When $\tau_{PH(effective)}$ of the emitting material is within these ranges above, a density of the triplet excitons in an emission layer of a light-emitting device including the emitting material may decrease. When a density of the triplet excitons in the emission layer is high, a probability of a triplet-triplet annihilation (TTA) of the triplet excitons being lost before contributing to light emission undergoing a radiative transition to a ground state may increase. However, since $\tau_{PH(effective)}$ of the emitting material is very short as described above, the triplet excitons of the emitting material undergo a radiative transition to a ground state at a very fast rate, which may result in a relatively low density of the triplet excitons in the emission layer, and thus a probability of TTA may be minimized. Therefore, a light-emitting device including the emitting material described above may have high efficiency and a long lifespan.

Moreover, the probability of TTA increases further when the light-emitting device is operated at a high current density, and thus the TTA may become a main cause of a roll-off phenomenon (a phenomenon of a decrease in efficiency of a light-emitting device operated under a high current density) in the light-emitting device. However, since $\tau_{PH(effective)}$ of the emitting material is very short as described above, the probability of TTA may be minimized, and thus the light-emitting device including the emitting material may have a low roll-off ratio.

A difference between an $S_1$ energy level and a $T_1$ energy level of the emitting material having $K_{ISC}/K_{RISC}$ within these ranges above may be, for example, about 1 millielectron volts (meV) or greater and less than about 200 meV, but embodiments are not limited thereto. When the difference between an $S_1$ energy level and a $T_1$ energy level of the emitting material is within this range, the emitting material may have a relatively large $K_{RISC}$.

Figure 2:
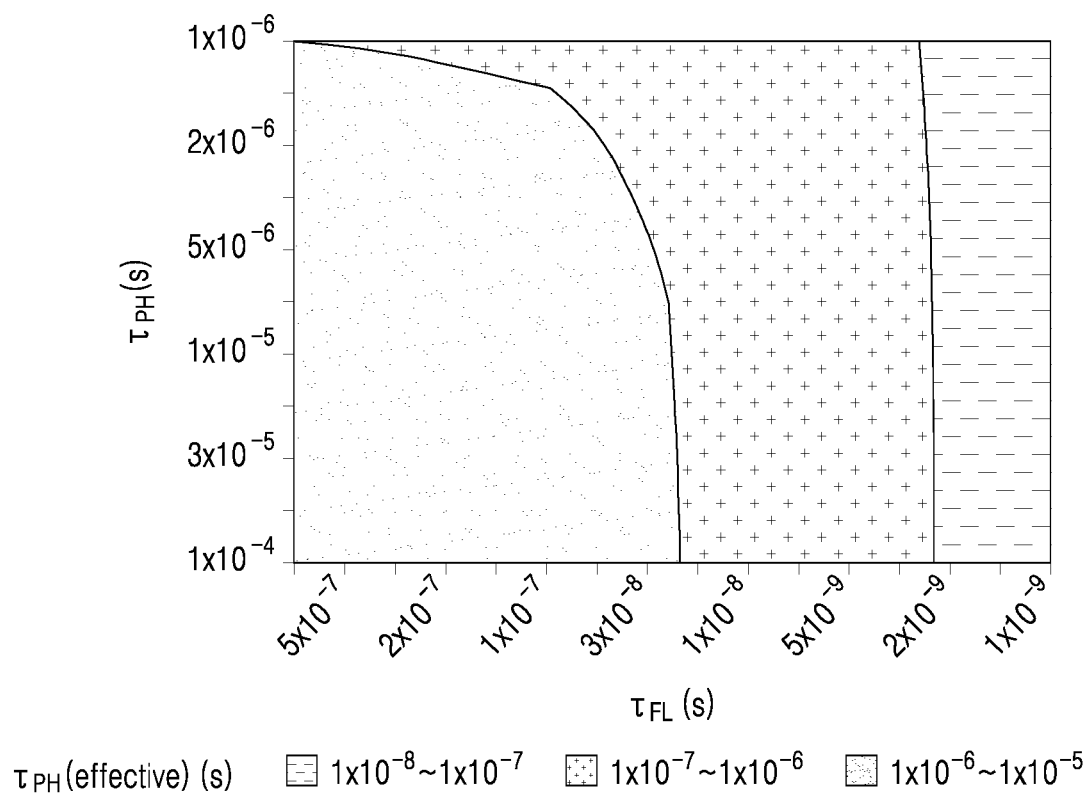
Figure 3:
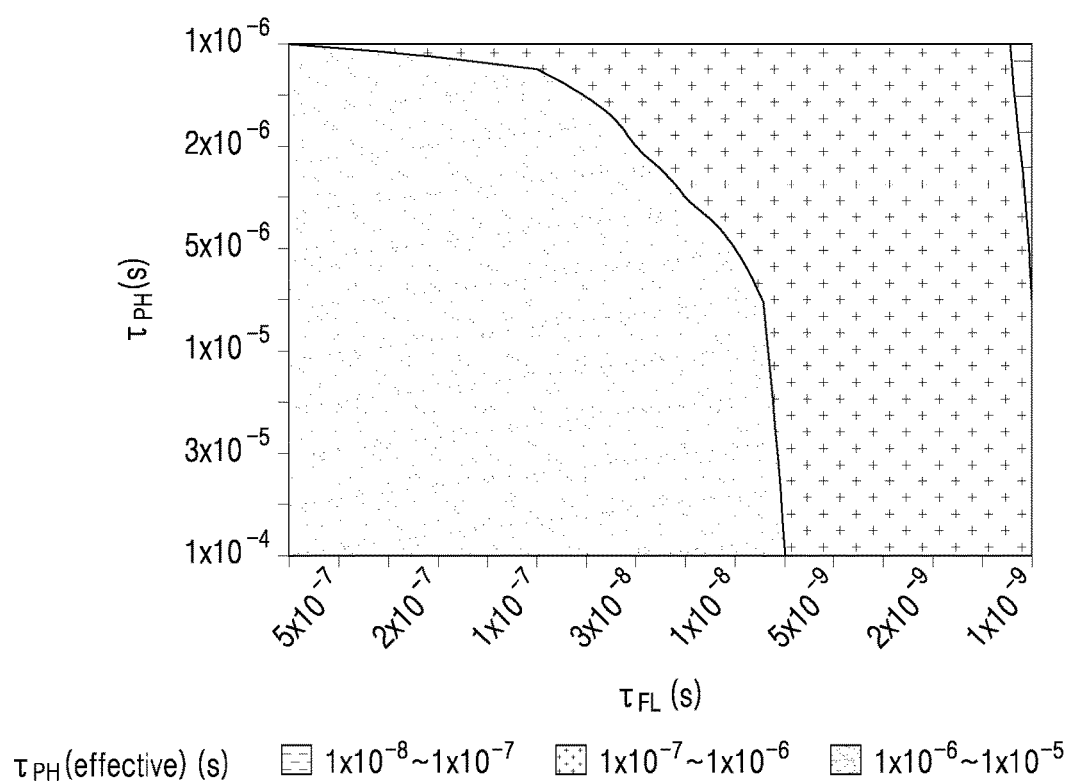
Figure 4:
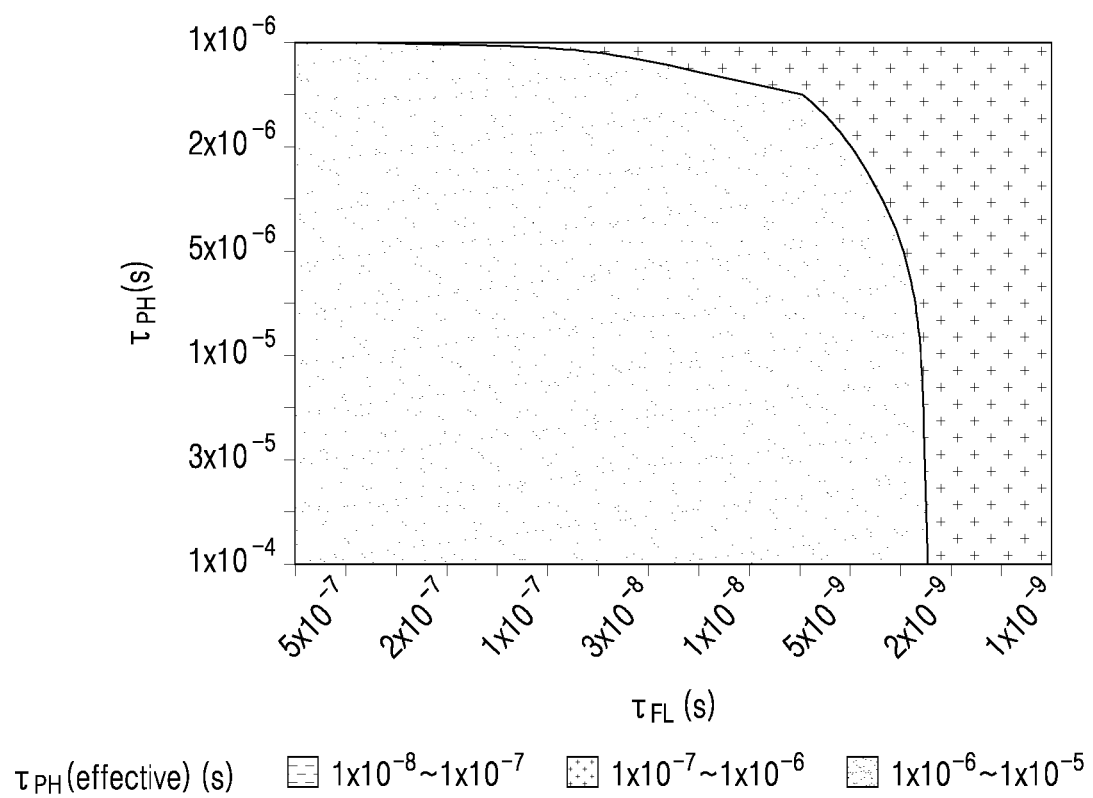
Figure 5:
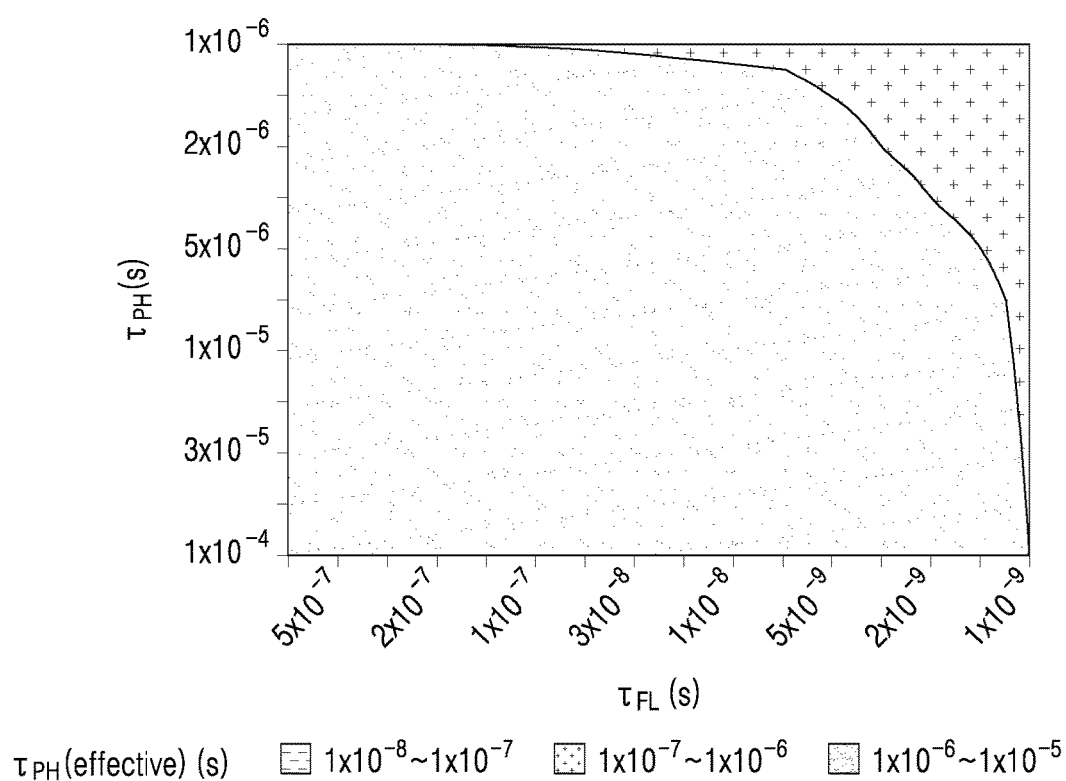

In some embodiments, i) $K_{ISC}/K_{RISC}$ of the emitting material is about 10 or greater and less than about 50 (e.g., about 10 or greater and less than about 20), and $K_{FL(original)}$ is about $2\times10^7$ s$^{-1}$ or greater (e.g., see FIG. 1);

ii) $K_{ISC}/K_{RISC}$ of the emitting material is about 50 or greater and less than about 100 (e.g., about 50 or greater and less than about 60), and $K_{FL(original)}$ is about $6\times10^7$ s$^{-1}$ or greater (e.g., see FIG. 2);

iii) $K_{ISC}/K_{RISC}$ of the emitting material is about 100 or greater and less than about 500 (e.g., about 100 or greater and less than about 200), and $K_{FL(original)}$ is about $2\times10^8$ s$^{-1}$ or greater (e.g., see FIG. 3); or iv) $K_{ISC}/K_{RISC}$ of the emitting material is about 500 or greater and less than about 1,000 (e.g., about 500 or greater and less than about 600), and $K_{FL(original)}$ is about $6\times10^8$ s$^{-1}$ or greater (e.g., see FIG. 4).

$\tau_{PH(effective)}$ of the emitting material that satisfies these ranges above may be selected from a range of about $1\times10^{-8}$ s to about $1\times10^{-6}$ s, but embodiments are not limited thereto.

In some embodiments, i) $K_{ISC}/K_{RISC}$ of the emitting material is about 10, and $K_{FL(original)}$ is about $2\times10^7$ s$^{-1}$ or greater (see FIG. 1);

ii) $K_{ISC}/K_{RISC}$ of the emitting material is about 50, and $K_{FL(original)}$ is about $6\times10^7$ s$^{-1}$ or greater (see FIG. 2);

iii) $K_{ISC}/K_{RISC}$ of the emitting material is about 100 or greater, and $K_{FL(original)}$ is about $2\times10^8$ s$^{-1}$ or greater (see FIG. 3); or iv) $K_{ISC}/K_{RISC}$ of the emitting material is about 500, and $K_{FL(original)}$ is about $6\times10^8$ s$^{-1}$ or greater, and $\tau_{PH(effective)}$ of the emitting material is selected from a range of about $1\times10^{-8}$ s to about $1\times10^{-6}$ s.

In some embodiments, a) $K_{ISC}/K_{RISC}$ of the emitting material is about 10 or greater and less than about 50 (e.g., about 10 or greater and less than about 20), and $K_{FL(original)}$ is about $2\times10^8$ s$^{-1}$ or greater (e.g., see FIG. 1); or b) $K_{ISC}/K_{RISC}$ of the emitting material is about 50 or greater and less than about 100 (e.g., about 50 or greater and less than about 60), and $K_{FL(original)}$ is about $6\times10^8$ s$^{-1}$ or greater (e.g., see FIG. 2).

$\tau_{PH(effective)}$ of the emitting material that satisfies these ranges above may be selected from a range of about $1\times10^{-8}$ s to about $1\times10^{-7}$ s, but embodiments are not limited thereto.

In some embodiments, a) $K_{ISC}/K_{RISC}$ of the emitting material is about 10, and $K_{FL(original)}$ is about $2\times10^8$ s$^{-1}$ or greater (see FIG. 1); or b) $K_{ISC}/K_{RISC}$ of the emitting material is about 50, and $K_{FL(original)}$ is about $6\times10^8$ s$^{-1}$ or greater (see FIG. 2), and $\tau_{PH(effective)}$ of the emitting material is selected from a range of about $1\times10^{-8}$ s to about $1\times10^{-7}$ s.

FIGS. 1 to 6 are views that illustrate $\tau_{PH(effective)}$ (s) values according to $K_{PH(original)}$ (s$^{-1}$) (x-axis) and $K_{FL(original)}$ (s$^{-1}$) (y-axis) of the emitting material having $K_{ISC}/K_{RISC}$ of 10, 50, 100, 500, 1,000, and 500, respectively.

Figure 6:
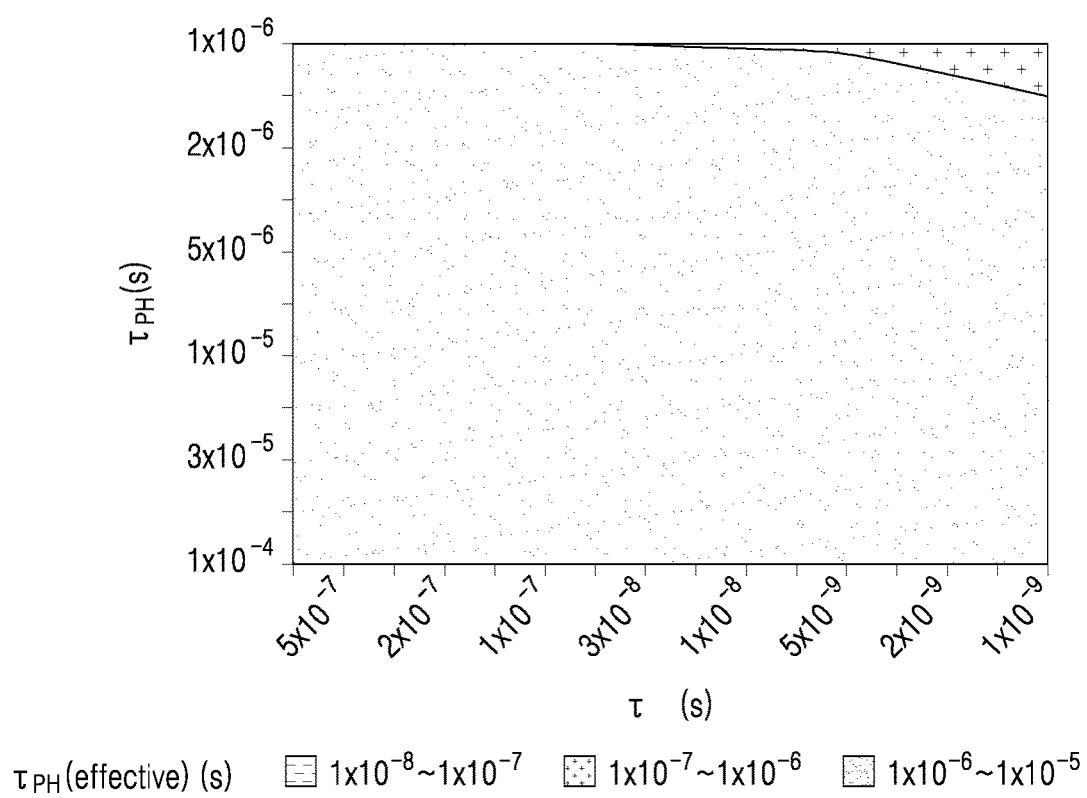

Referring to FIGS. 1 to 6, $\tau_{PH(effective)}$ of the emitting materials that satisfy conditions of FIGS. 1 to 5 may be in a range of about $1\times10^{-8}$ s to about $1\times10^{-6}$ s, but it was confirmed that $\tau_{PH(effective)}$ of the emitting material that satisfies conditions of FIG. 6 may not substantially be in a range of about $1\times10^{-8}$ s to about $1\times10^{-6}$ s.

The emitting material may include a third row transition metal.

In some embodiments, the emitting material may be an organic metal compound including a third row transition metal and at least one ligand.

In some embodiments, the emitting material may include iridium, platinum, osmium, rhenium, rhodium, palladium, nickel, magnesium, zinc, gadolinium, silver, copper, or cobalt.

In some embodiments, the emitting material may be an organic metal compound that includes iridium, platinum, osmium, rhenium, rhodium, palladium, nickel, magnesium, zinc, gadolinium, silver, copper, or cobalt; and at least one ligand.

Examples of the light-emitting device that may include the emitting material may include a lighting device, an organic light-emitting device, and a light source.

For example, the light-emitting device may be an organic light-emitting device, and the organic light-emitting device may include:

a first electrode;

a second electrode; and an organic layer disposed between the first electrode and the second electrode, wherein the organic layer includes an emission layer, and wherein the emission layer includes the emitting material.

About 90% or more, for example, about 95% or more, or, for example, about 98% or more of light emitted from the emission layer of the organic light-emitting device may be light emitted from the emitting material. That is, the emitting material included in the emission layer of the organic light-emitting device serves as a main emitter and is not a host or an auxiliary dopant.

The emission layer of the organic light-emitting device may further include a host in addition to the emitting material, and an amount of the emitting material in the emission layer may be less than an amount of the host in the emission layer. That is, the emitting material may serve as a dopant, or, for example, a phosphorescent dopant, in the emission layer.

When the emission layer of the organic light-emitting device includes a host and the emitting material (which serves as a dopant), an amount of the emitting material may be selected from a range of about 0.01 parts to about 20 parts by weight based on about 100 parts by weight of the emission layer, but embodiments are not limited thereto. When an amount of the emitting material is within this range, light may be emitted without the occurrence of a quenching phenomenon.

Figure 7:
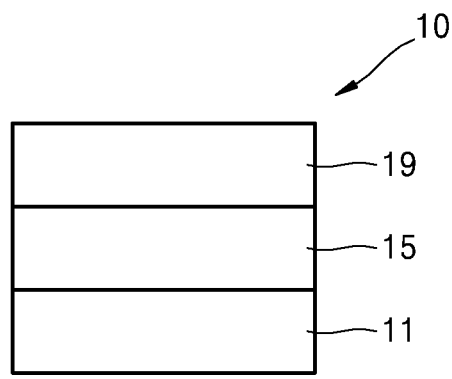
FIG. 7 is a schematic cross-sectional view of an organic light-emitting device according to an embodiment.

FIG. 7 shows a schematic cross-sectional view of an organic light-emitting device 10 according to an embodiment. The organic light-emitting device 10 of FIG. 7 has a structure in which a first electrode 11, an organic layer 15, and a second electrode 19 are sequentially stacked in this stated order.

The organic layer 15 may include a hole transport region, an emission layer, and an electron transport region, and the emitting material may be included in the emission layer.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

Materials used in the first electrode 11, the hole transport region, the electron transport region, and the second electrode 19, and layer thicknesses of the first electrode 11, the hole transport region, the electron transport region, and the second electrode 19, may be selected by those of ordinary skill in the art.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide (SnO$_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstroms per second (Å/sec) to about 0 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4′,4″-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

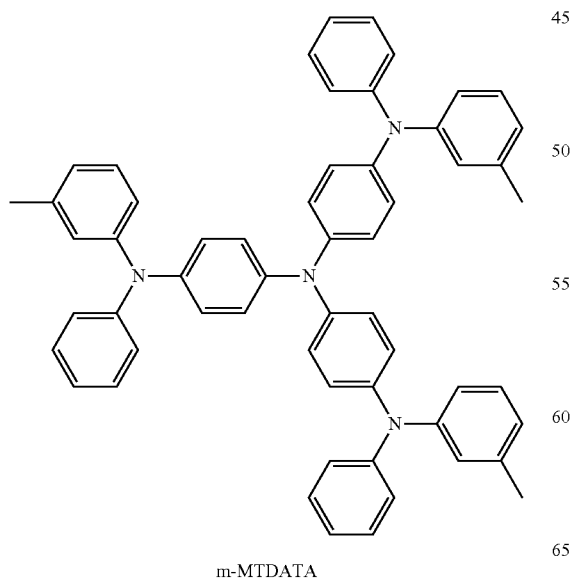

m-MTDATA

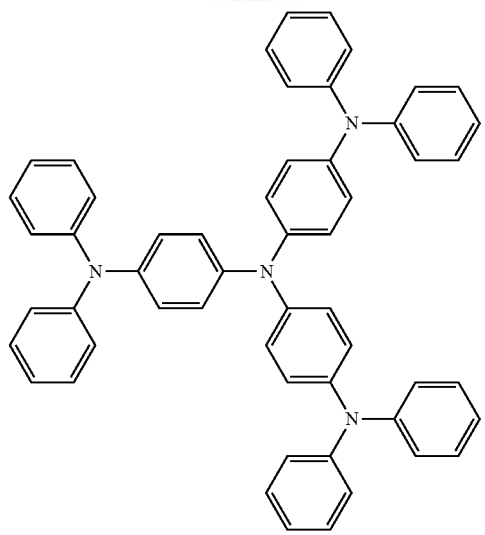

TDATA

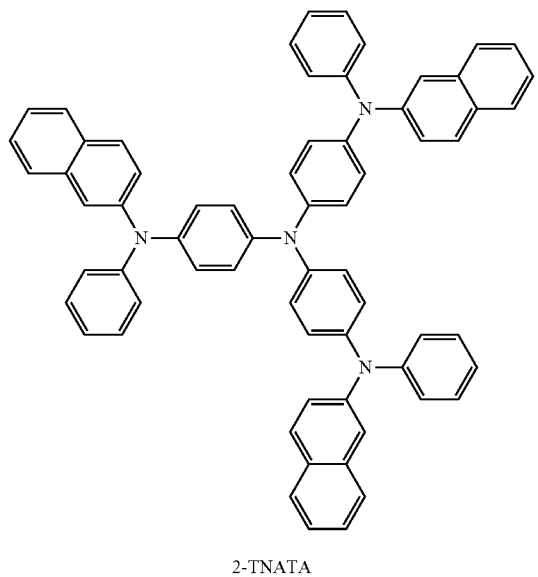

2-TNATA

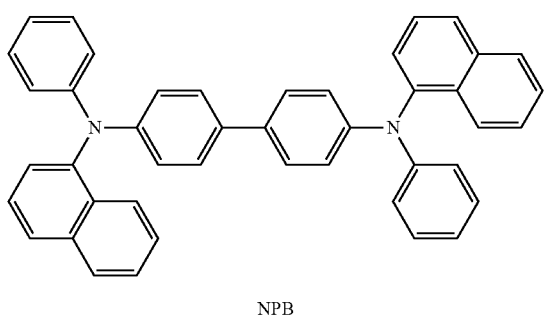

NPB

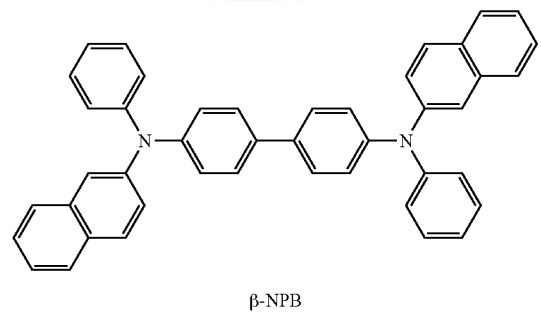

β-NPB

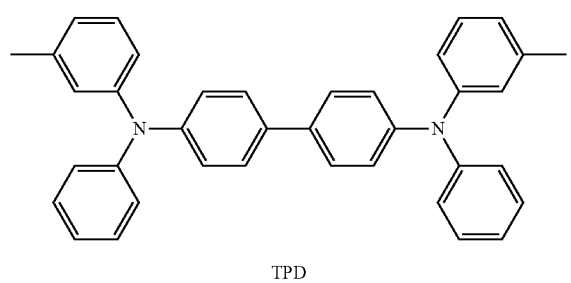

TPD

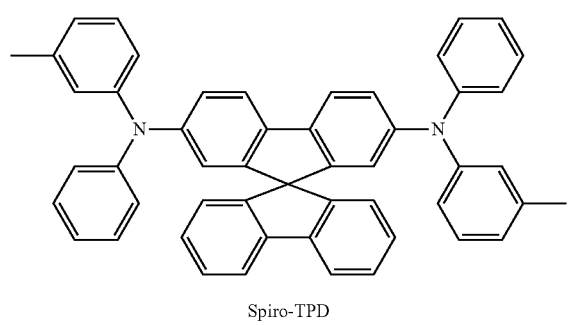

Spiro-TPD

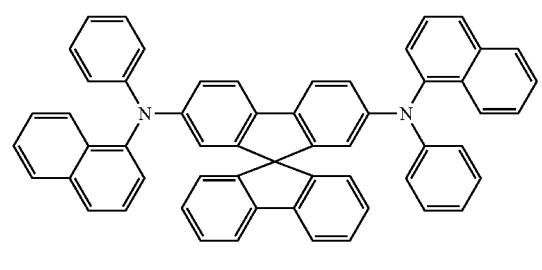

Spiro-NPB

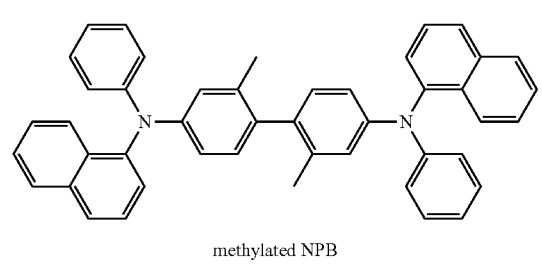

methylated NPB

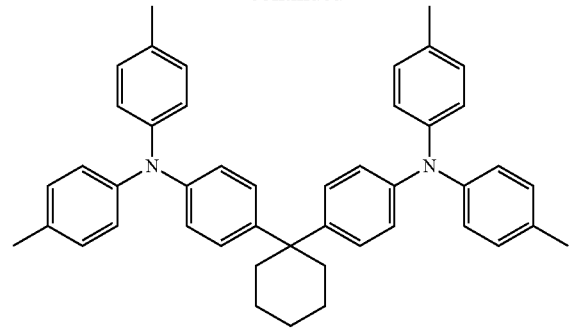

TAPC

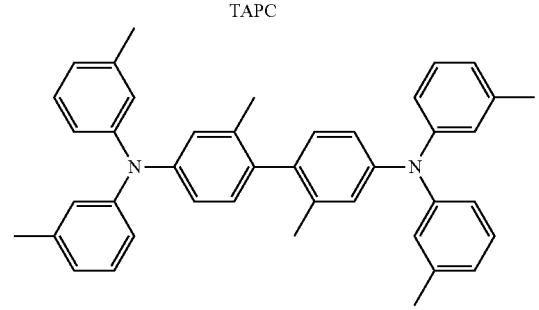

HMTPD

Formula 201

Formula 202

$Ar_{101}$ and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer from 0 to 5, or 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

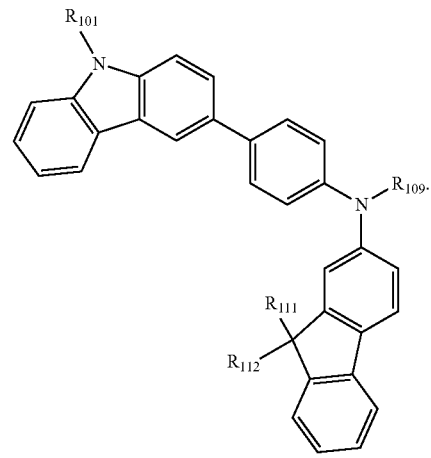

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto:

HT1

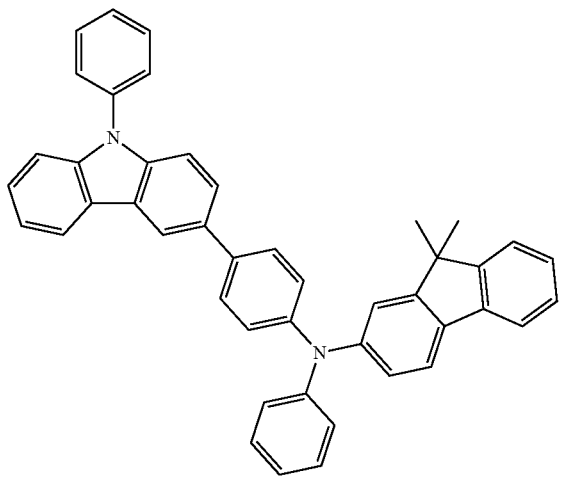

HT2
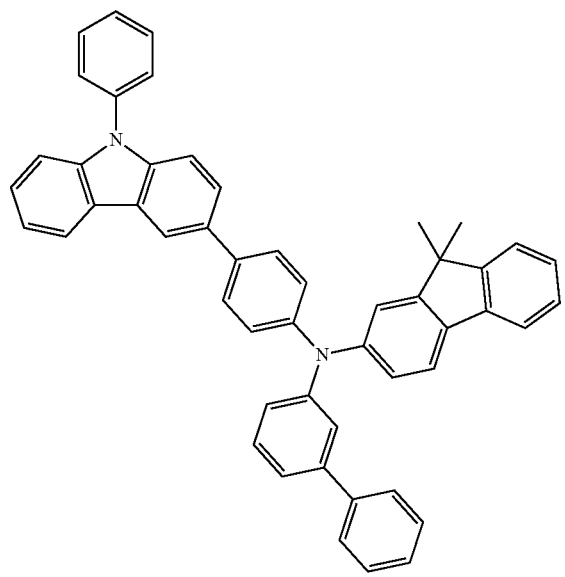
HT3
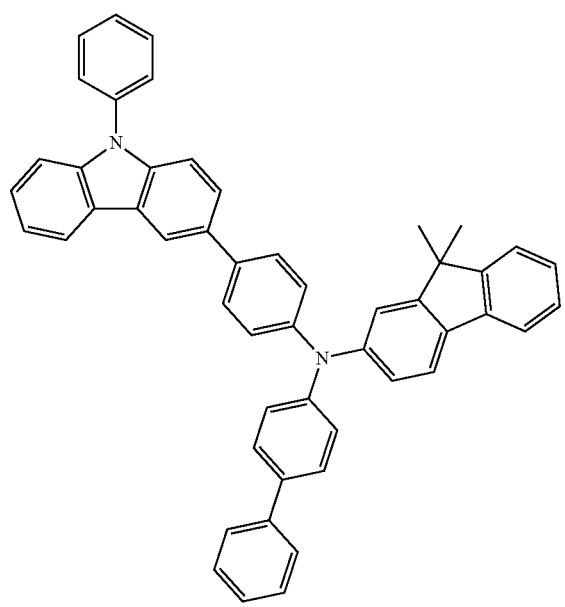
HT4
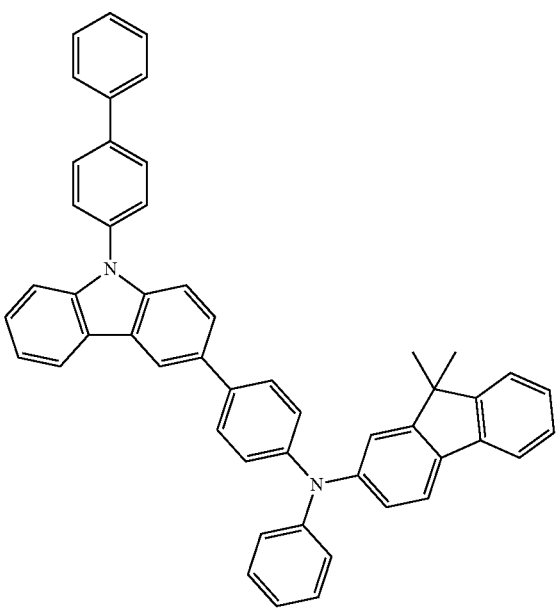
HT5
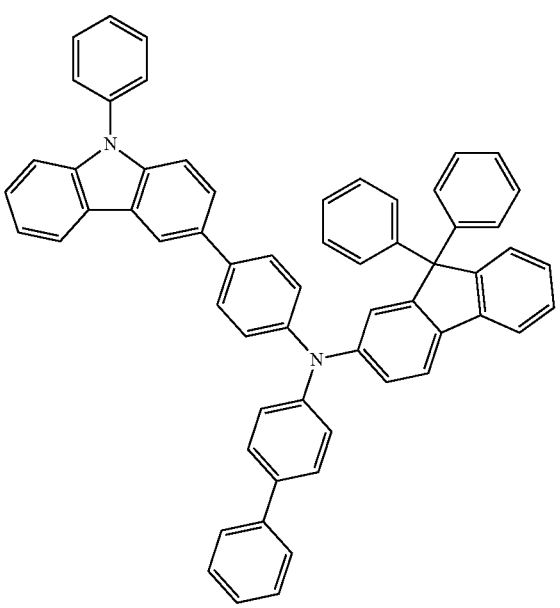

HT6
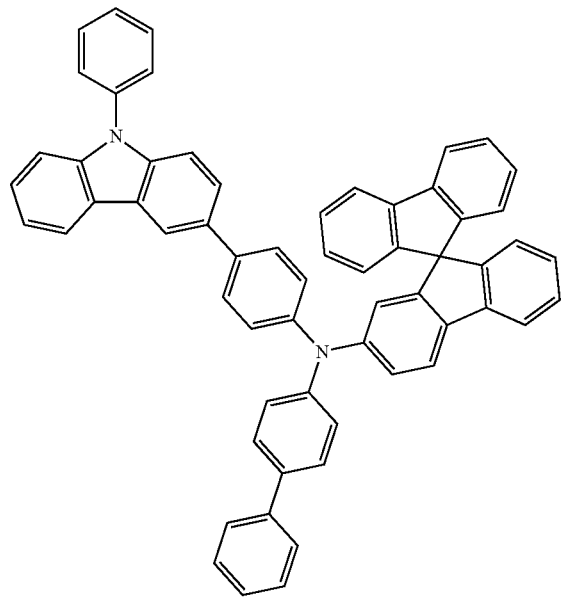
HT7
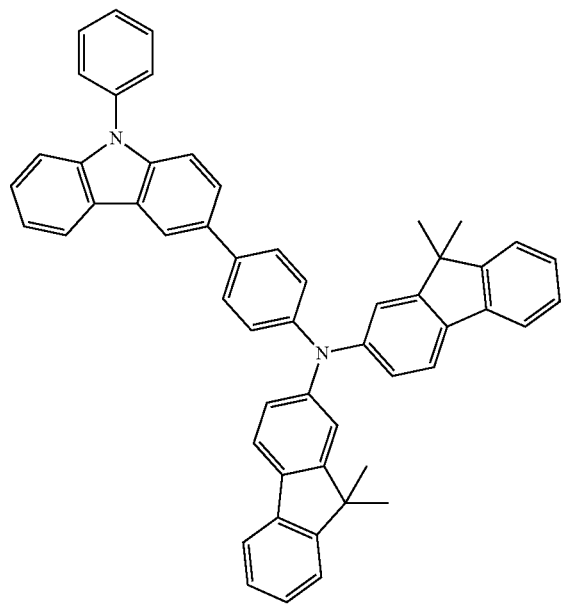
HT8
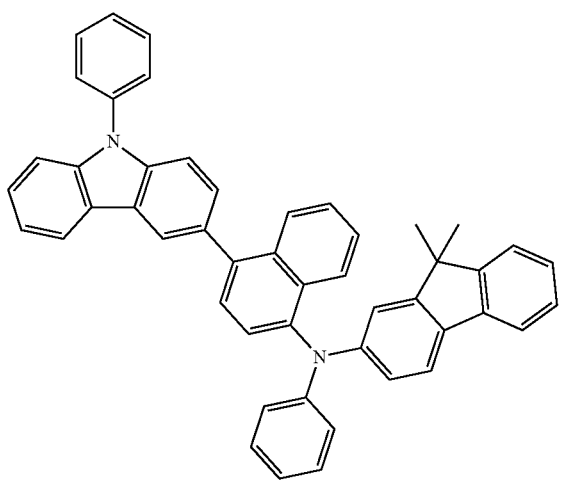
HT9
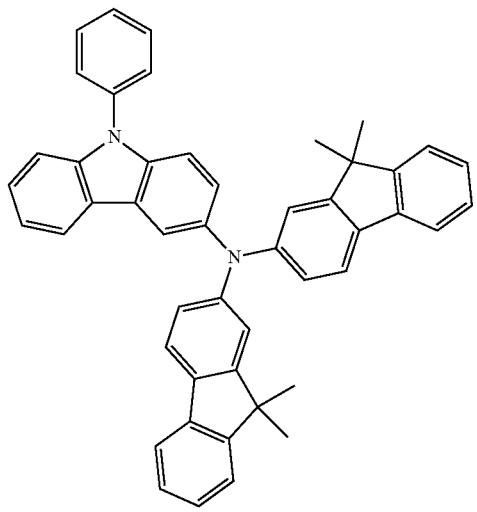
HT10
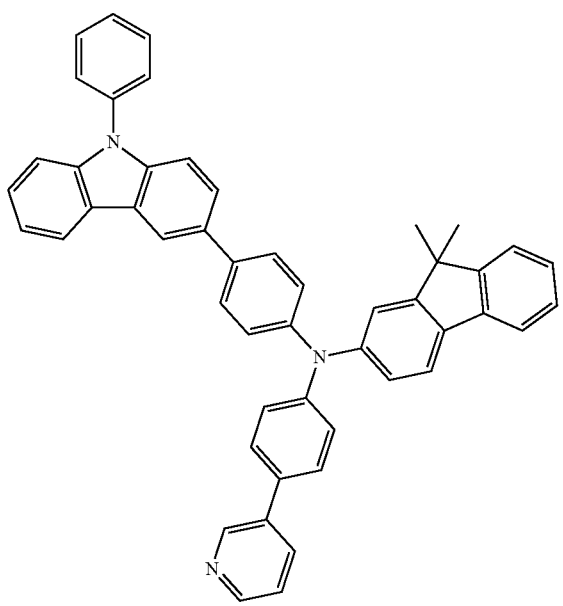

HT11
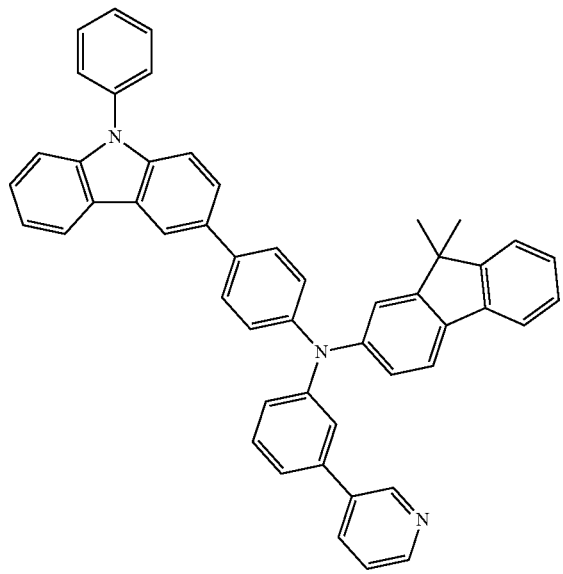
HT12
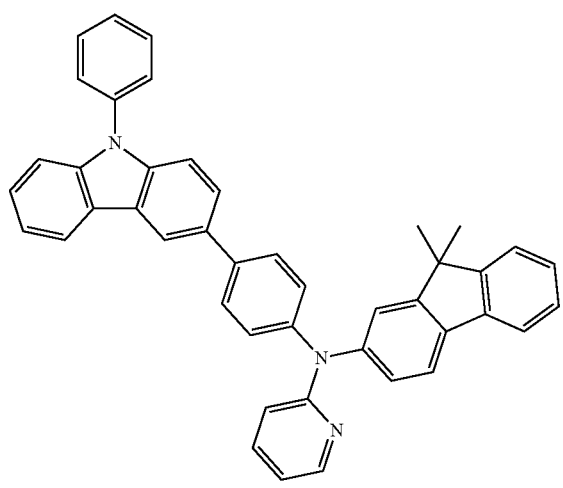
HT13
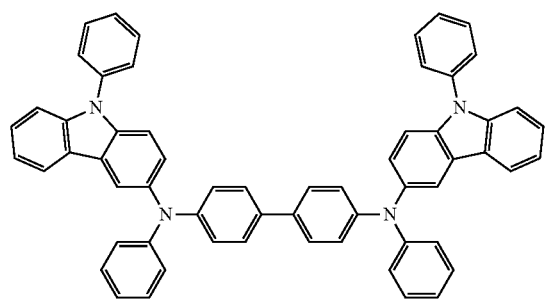
HT14
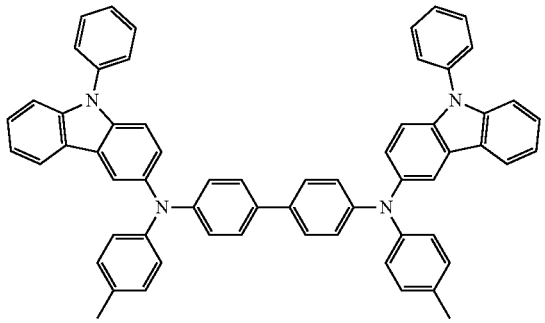
HT15
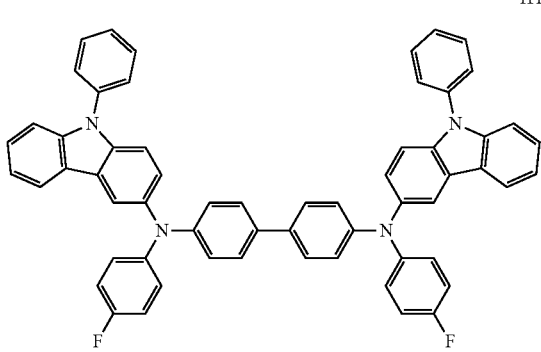
HT16
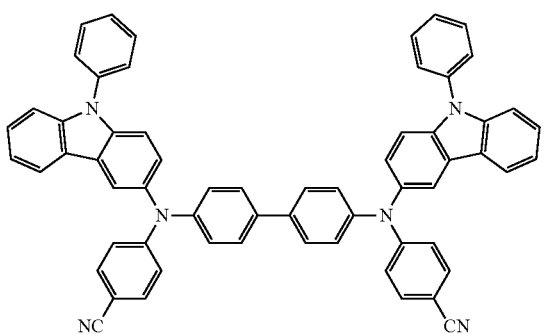
HT17
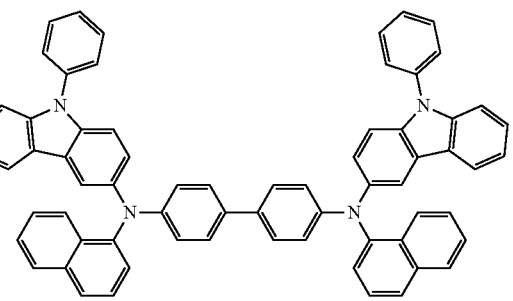

-continued

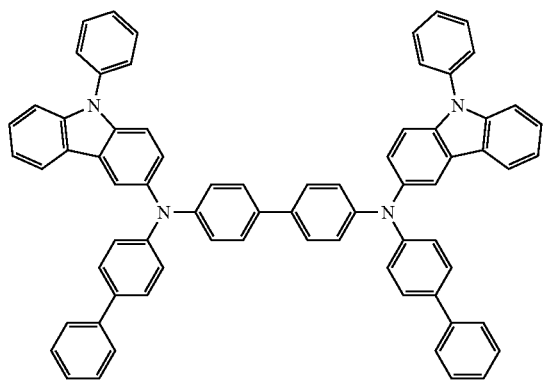

HT18

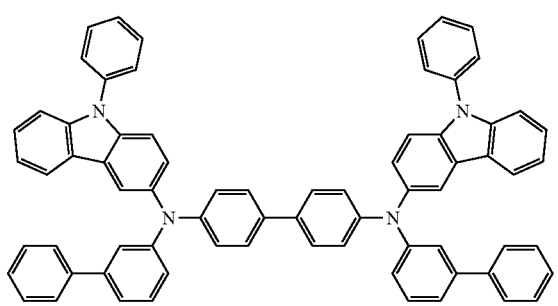

HT19

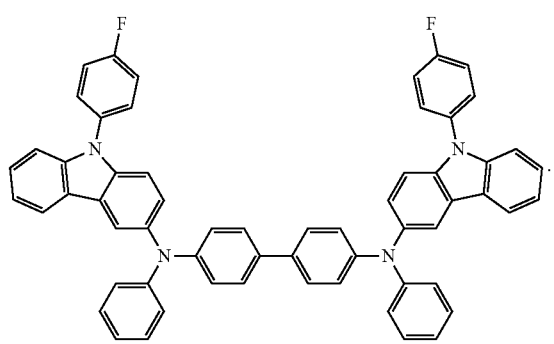

HT20

A thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto:

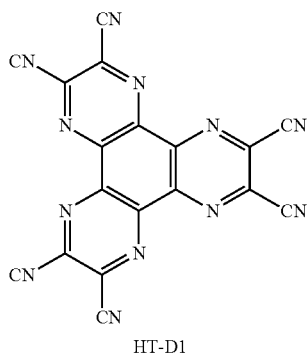

HT-D1

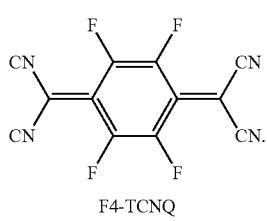

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organic metal compound including a third row transition metal.

The host may include at least one selected from TPBi, TBADN, ADN (also referred to as "DNA"), CBP, CDBP, TCP, mCP, Compound H50, and Compound H51:

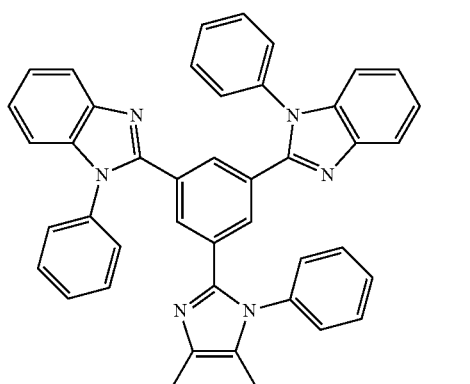
TPBi
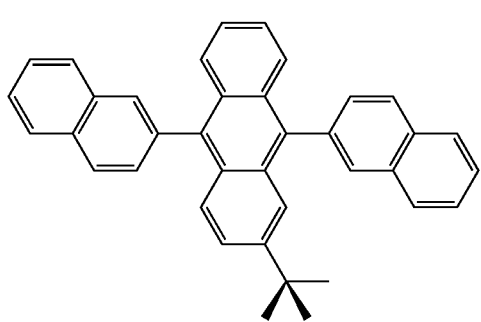
TBADN
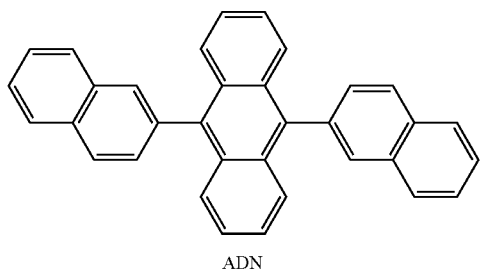
ADN
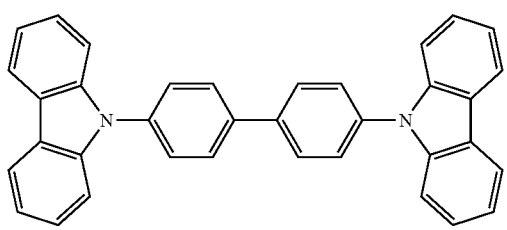
CBP
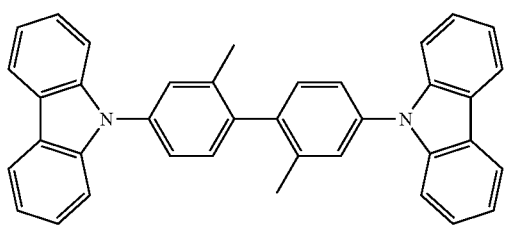
CDBP
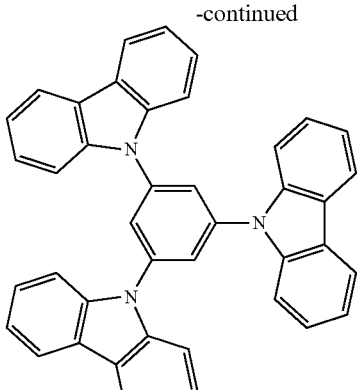
TCP
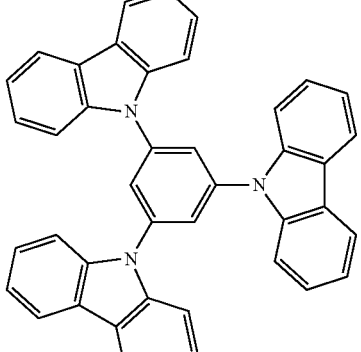
mCP
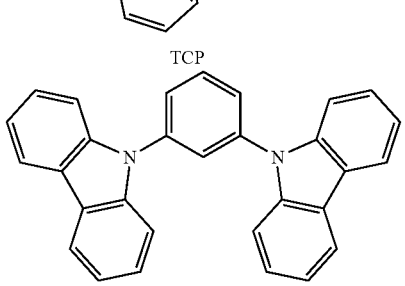
H50
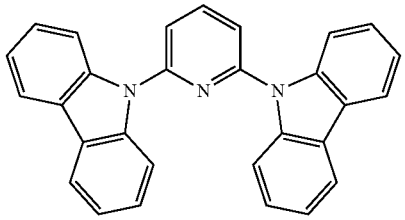
H51
In one or more embodiments, the host may further include a compound represented by Formula 301 below.
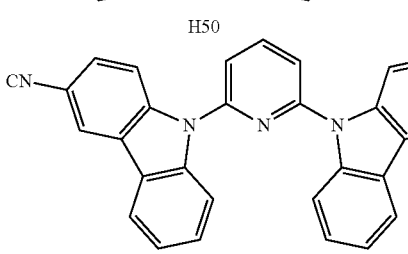
Formula 301
$Ar_{111}$ and $Ar_{112}$ in Formula 301 may each independently be selected from:
a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:
- a $C_1$-$C_{10}$ alkyl group, a phenyl group, a naphthyl group, a phenanthrenyl group, and a pyrenyl group; and
- a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer from 0 to 4, and may be, for example, 0, 1, or 2.

$Ar_{113}$ to $Ar_{116}$ in Formula 301 may each independently be selected from:
- a $C_1$-$C_{10}$ alkyl group, substituted with at least one selected from a phenyl group, a naphthyl group, and an anthracenyl group;
- a phenyl group, a naphthyl group, an anthracenyl group, a pyrenyl, a phenanthrenyl group, and a fluorenyl group;
- a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a alkoxy group, a phenyl group, a naphthyl group, an anthracenyl group, a pyrenyl group, a phenanthrenyl group, and a fluorenyl group; and

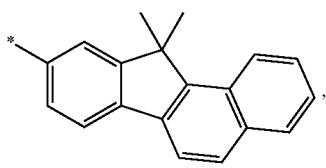 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

Formula 302

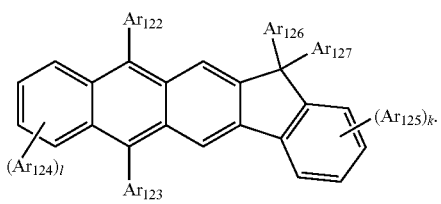

$Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto:

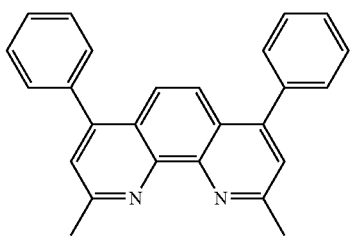

BCP

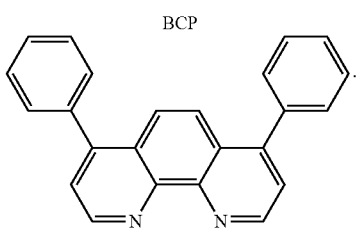

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, Alq$_3$, BAlq, TAZ, and NTAZ:

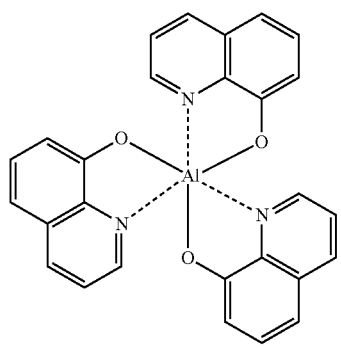

Alq$_3$

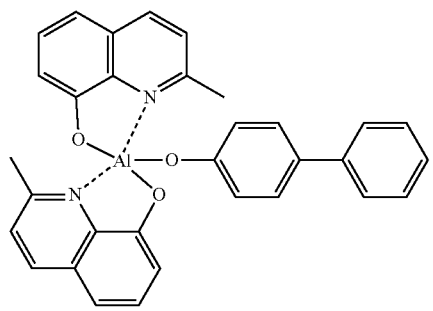

BAlq

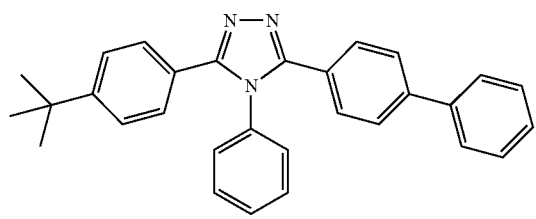

TAZ

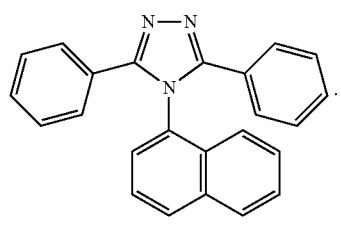

NTAZ

In one or more embodiments, the electron transport layer may include at least one of ET1 and ET25, but are not limited thereto:

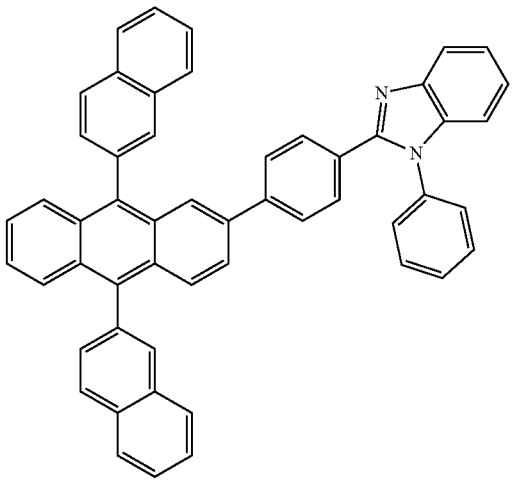

ET1

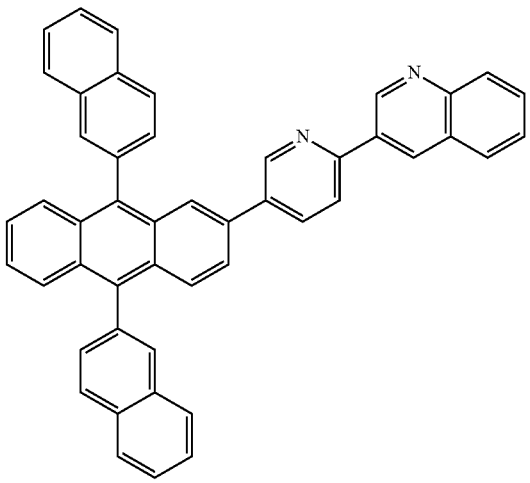

ET2

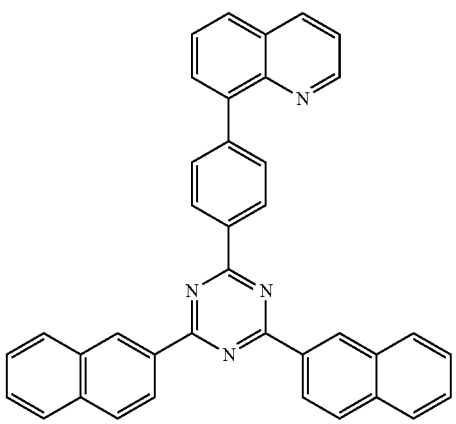

ET3

ET4
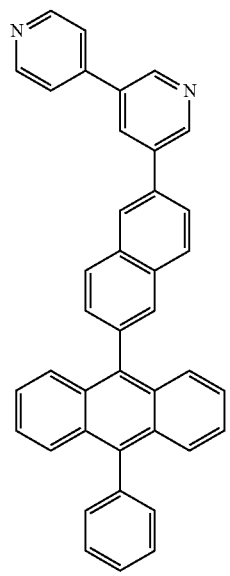
ET7
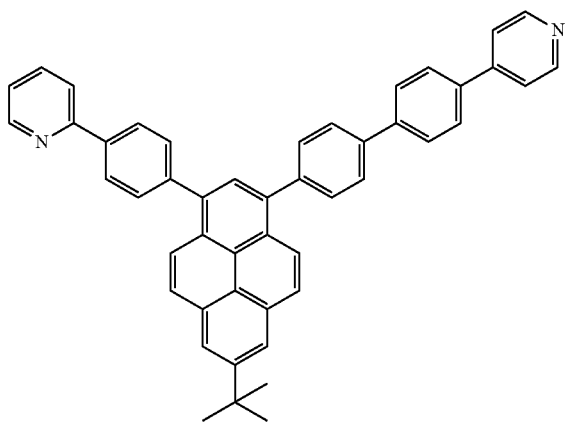
ET5
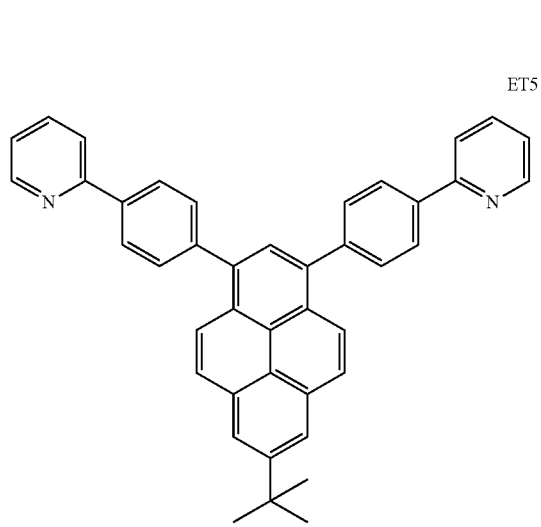
ET8
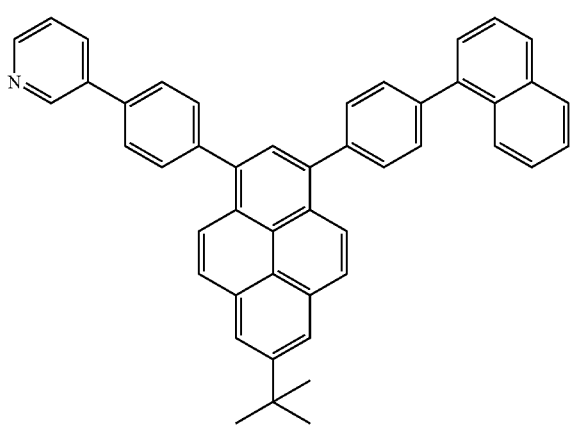
ET6
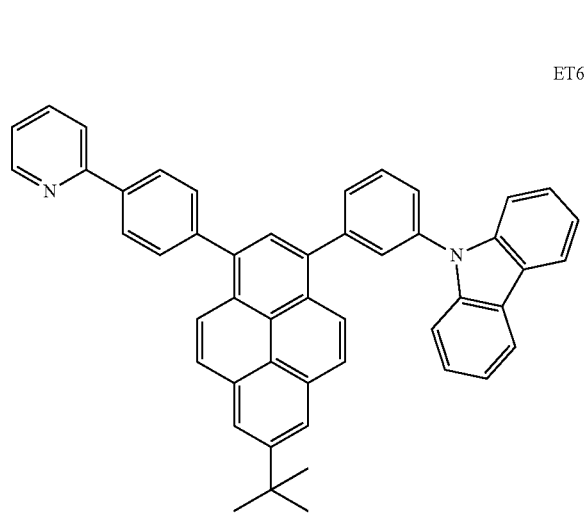
ET9
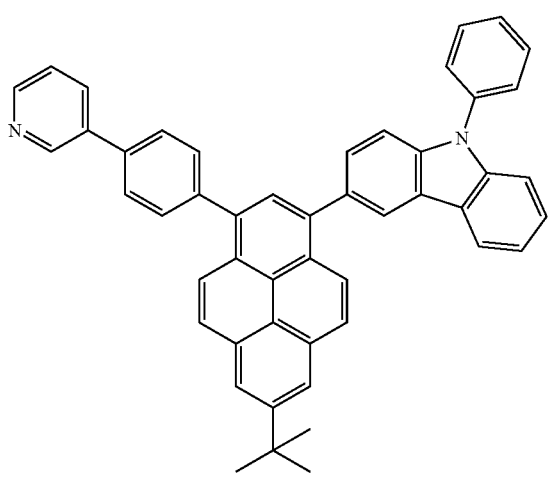

ET10
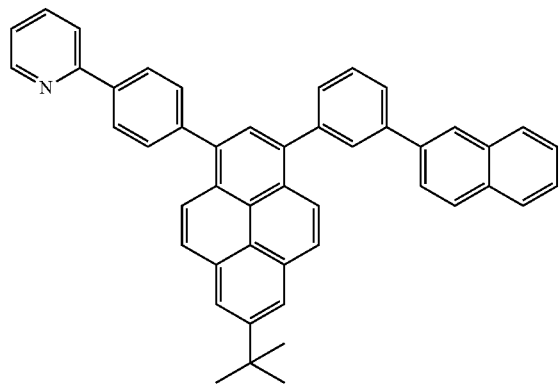
ET11
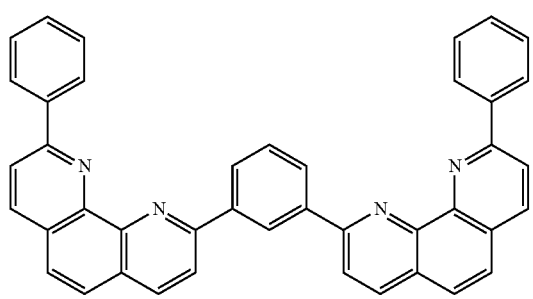
ET12
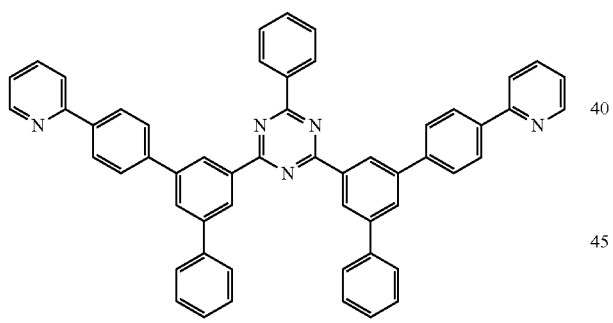
ET13
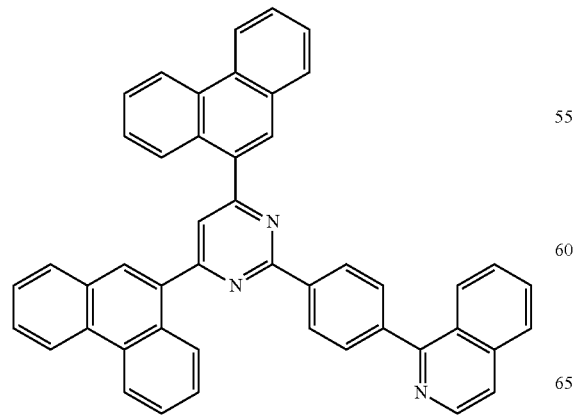
ET14
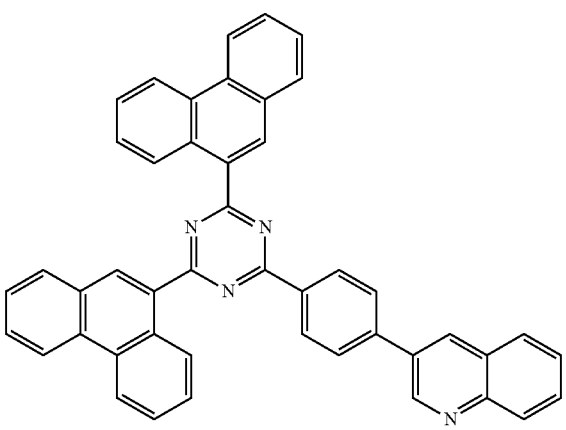
ET15
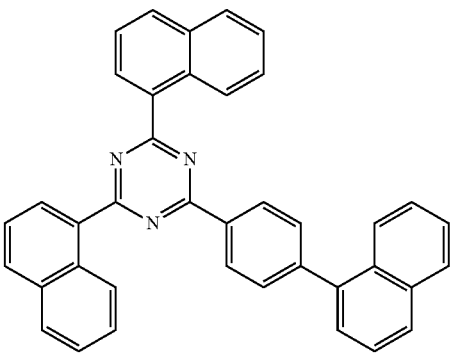
ET16
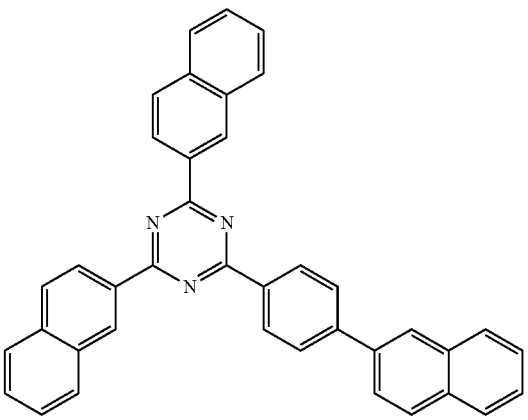

ET17
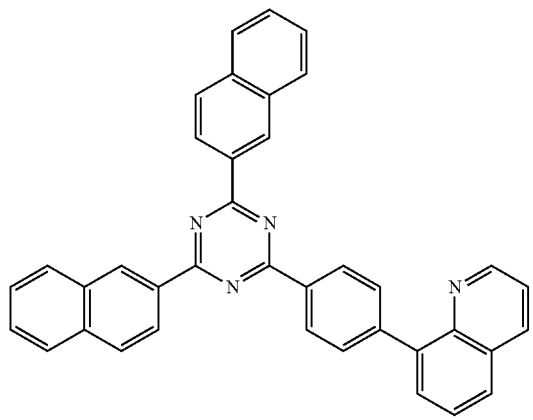
ET18
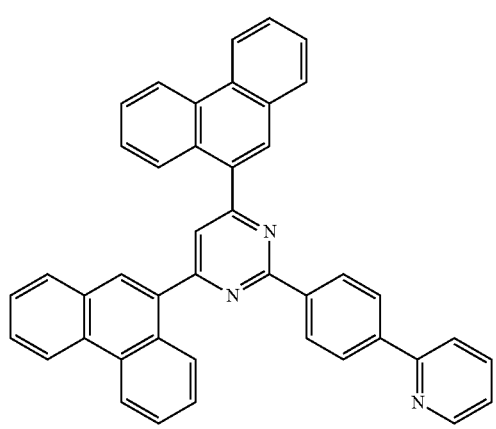
ET19
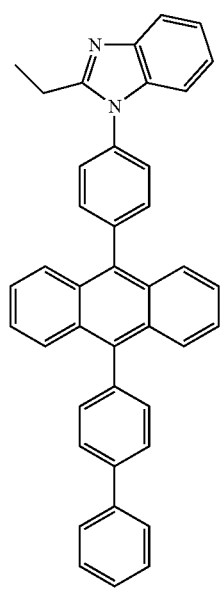
ET20
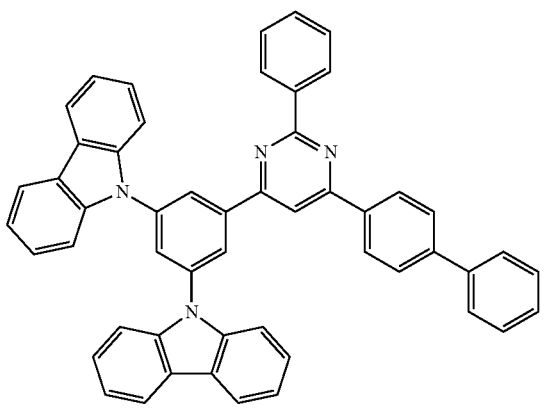
ET21
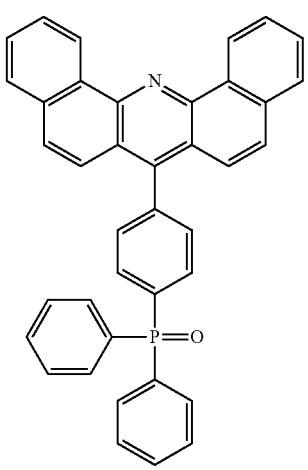
ET22
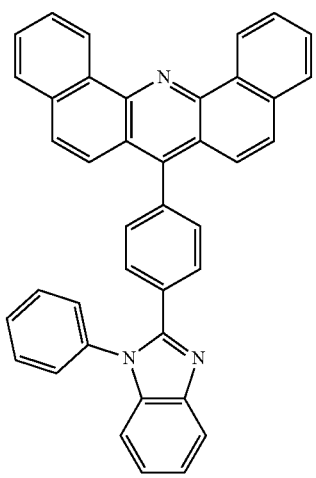

-continued

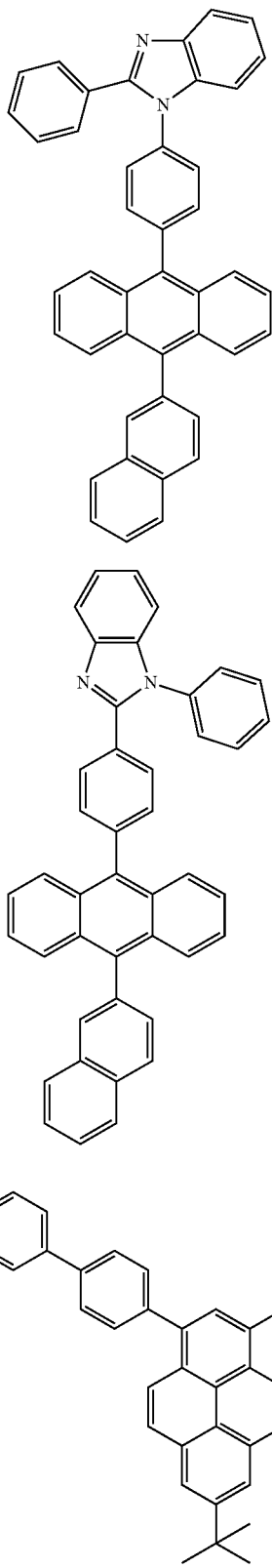

ET23

ET24

ET25

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2:

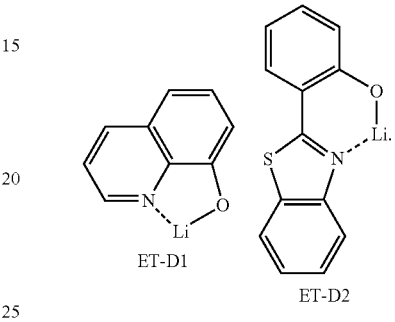

ET-D1

ET-D2

The electron transport region may include an electron injection layer that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

As described above, according to one or more embodiments, a light-emitting device including the emitting material satisfying those conditions above may have high light-emitting efficiency, a long lifespan, and a low roll-off ratio.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group.

The term "$C_1$-$C_{10}$ heterocycloalkyl group" as used herein refers to a monovalent saturated monocyclic group having at least one heteroatom selected from N, O, P, $S_1$ and S as a ring-forming atom and 1 to 10 carbon atoms, and non-limiting examples thereof include a tetrahydrofuranyl group, and a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in the ring thereof and that has no aromaticity, and non-limiting examples thereof include a cyclopentenyl group, a cyclohexenyl group, and a cycloheptenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group.

The term "$C_6$-$C_{60}$ aryl group" as used herein refers to a monovalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group includes two or more rings, the rings may be fused to each other. The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a carbocyclic aromatic system that has at least one heteroatom selected from N, O, P, Si, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group includes two or more rings, the rings may be fused to each other. The term "$C_2$-$C_{60}$ alkylheteroaryl group" refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ is the $C_6$-$C_{60}$ aryl group), and the term a "$C_6$-$C_{60}$ arylthio group" as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and having no aromaticity in its entire molecular structure. Examples of the monovalent non-aromatic condensed polycyclic group include a fluorenyl group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as-defined by the following claims.

What is claimed is:

1. A light-emitting device comprising an emitting material, wherein
    $K_{ISC}/K_{FL(original)}$ of the emitting material is about 100 or greater,
    $K_{RISC}/K_{PH(original)}$ of the emitting material is about 100 or greater,
    $K_{ISC}/K_{RISC}$ of the emitting material is about 0.9 or greater and about 1,000 or less, wherein, among all emission components of the emitting material, a ratio of a phosphorescent emission component that is emitted by a radiative transition of a triple exciton to a ground state is 90% or greater, wherein the $K_{ISC}$ is an intersystem crossing rate of the emitting material from a lowest excited singlet ($S_1$) energy level to a lowest excited triplet ($T_1$) energy level, the $K_{RISC}$ is a reverse intersystem crossing rate of the emitting material from a $T_1$ energy level to an $S_1$ energy level, the $K_{FL(original)}$ is a radiative transition rate of a singlet exciton of the emitting material from an $S_1$ energy level to a ground state under a system in which intercrossing of excitons of the emitting material is assumed not to occur between the singlet energy level of the emitting material and the triplet energy level of the emitting material, the $K_{PH(original)}$ is a radiative transition rate of the triplet exciton of the emitting material from a $T_1$ energy level to a ground state under a system in which intercrossing of excitons of the emitting material is assumed not to occur between the singlet energy level of the emitting material and the triplet energy level of the emitting material, and the $K_{ISC}$, the $K_{RISC}$, the $K_{FL(original)}$, the $K_{PH(original)}$, and the ratio of the phosphorescent emission component are evaluated from a transient photoluminescence (PL) spectrum per temperature of the emitting material.

2. The light-emitting device of claim 1, wherein $K_{ISC}/K_{RISC}$ of the emitting material is about 10 or greater and about 1,000 or less.

3. The light-emitting device of claim 1, wherein $K_{ISC}/K_{RISC}$ of the emitting material is about 10 or greater and about 500 or less.

4. The light-emitting device of claim 1, wherein $K_{ISC}/K_{RISC}$ of the emitting material is about 10 or greater and about 50 or less.

5. The light-emitting device of claim 1, wherein $K_{FL(original)}$ of the emitting material is about $1\times10^7$ reverse seconds ($s^{-1}$) or greater.

6. The light-emitting device of claim 1, wherein $K_{FL(original)}$ of the emitting material is about $2\times10^8$ reverse seconds ($s^{-1}$) or greater.

7. The light-emitting device of claim 1, wherein $K_{PH(original)}$ of the emitting material is about $1\times10^4$ reverse seconds ($s^{-1}$) or greater.

8. The light-emitting device of claim 1, wherein $R_{PH}$ of the emitting material defined according to Equation 1 is about 0.9 or greater and less than about 1:

$$R_{PH}=K_{ISC}/(K_{RISC}+K_{ISC}) \qquad \text{Equation 1}$$

9. The light-emitting device of claim 1, wherein $K_{PH(effective)}$ and $K_{FL(effective)}$ of the emitting material are the same, the $K_{PH(effective)}$ is a radiative transition rate of the triplet exciton of the emitting material from a $T_1$ energy level to a ground state under a steady state system in which intercrossing of excitons of the emitting material between the singlet energy level of the emitting material and the triplet energy level of the emitting material occurs at the rates of the $K_{ISC}$ and the $K_{RISC}$, the $K_{FL(effective)}$ is a radiative transition rate of a singlet exciton of the emitting material from an $S_1$ energy level to a ground state under a steady state system in which intercrossing of excitons of the emitting material between the singlet energy level of the emitting material and the triplet energy level of the emitting material occurs at the rates of the $K_{ISC}$ and the $K_{RISC}$, and the $K_pH(effective)$ and the $K_{FL(effective)}$ of the emitting material defined according to Equation 2 are selected from a range of about $1\times10^6$ reverse seconds (s$^{-1}$) to about $1\times10^9$ reverse seconds (s$^{-1}$):

$$K_{PH(effective)} = K_{FL(effective)} = R_{PH} \times K_{PH(original)} + (1-R_{PH}) \times K_{FL(original)} \quad \text{Equation 2}$$

wherein, in Equation 2, $R_{PH}$ is $K_{ISC}/(K_{RISC}+K_{ISC})$.

10. The light-emitting device of claim 1, wherein $\tau_{PH(effective)}$ of the emitting material is selected from a range of about $1\times10^{-9}$ seconds (s) to about $1\times10^{-6}$ seconds (s), the $\tau_{PH(effective)}$ is a decay time taken for a radiative transition of the triplet exciton of the emitting material from a $T_1$ energy level to a ground state under a steady state system in which intercrossing of excitons of the emitting material between the singlet energy level of the emitting material and the triplet energy level of the emitting material occurs at the rates of the $K_{ISC}$ and the $K_{RISC}$, and the $\tau_{PH(effective)}$ is evaluated from a room-temperature transient PL spectrum of the emitting material.

11. The light-emitting device of claim 1, wherein $\tau_{PH(effective)}$ of the emitting material is selected from a range of about $1\times10^{-8}$ seconds (s) to about $0.9\times10^{-6}$ seconds (s).

12. The light-emitting device of claim 1, wherein $\tau_{PH(effective)}$ of the emitting material is selected from a range of about $1\times10^{-8}$ seconds (s) to about $0.9\times10^{-7}$ seconds (s).

13. The light-emitting device of claim 1, wherein
   i) the $K_{ISC}/K_{RISC}$ of the emitting material is about 10 or greater and less than about 50, and the $K_{FL(original)}$ is about $2\times10^7$ reverse seconds (s$^{-1}$) or greater;
   ii) the $K_{ISC}/K_{RISC}$ of the emitting material is about 50 or greater and less than about 100, and the $K_{FL(original)}$ is about $6\times10^7$ reverse seconds (s$^{-1}$) or greater;
   iii) the $K_{ISC}/K_{RISC}$ of the emitting material is about 100 or greater and less than about 500, and the $K_{FL(original)}$ is about $2\times10^8$ reverse seconds (s$^{-1}$) or greater; or
   iv) the $K_{ISC}/K_{RISC}$ of the emitting material is about 500 or greater and less than about 1,000, and the $K_{FL(original)}$ is about $6\times10^8$ reverse seconds (s$^{-1}$) or greater.

14. The light-emitting device of claim 13, wherein $\tau_{PH(effective)}$ of the emitting material is selected from a range of about $1\times10^{-8}$ reverse seconds (s) to about $1\times10^{-6}$ reverse seconds (s).

15. The light-emitting device of claim 1, wherein
   i) the $K_{ISC}/K_{RISC}$ of the emitting material is about 10 or greater and less than about 20, and the $K_{FL(original)}$ is about $2\times10^7$ reverse seconds (s$^{-1}$) or greater;
   ii) the $K_{ISC}/K_{RISC}$ of the emitting material is about 50 or greater and less than about 60, and the $K_{FL(original)}$ is about $6\times10^7$ reverse seconds (s$^{-1}$) or greater;
   iii) the $K_{ISC}/K_{RISC}$ of the emitting material is about 100 or greater and less than about 200, and the $K_{FL(original)}$ is about $2\times10^8$ reverse seconds (s$^{-1}$) or greater; or
   iv) the $K_{ISC}/K_{RISC}$ of the emitting material is about 500 or greater and less than about 600, and the $K_{FL(original)}$ is about $6\times10^8$ reverse seconds (s$^{-1}$) or greater,
   wherein $\tau_{PH(effective)}$ of the emitting material is selected from a range of about $1\times10^{-8}$ seconds (s) to about $1\times10^{-6}$ seconds (s).

16. The light-emitting device of claim 1, wherein
   a) the $K_{ISC}/K_{RISC}$ of the emitting material is about 10 or greater and less than about 50, and the $K_{FL(original)}$ is about $2\times10^8$ reverse seconds (s$^{-1}$) or greater; or
   b) the $K_{ISC}/K_{RISC}$ of the emitting material is about 50 or greater and less than about 100, and the $K_{FL(original)}$ is about $6\times10^8$ reverse seconds (s$^{-1}$) or greater,
   wherein $\tau_{PH(effective)}$ of the emitting material is selected from a range of about $1\times10^{-8}$ seconds (s) to about $1\times10^{-7}$ seconds (s).

17. The light-emitting device of claim 1, wherein
   a) the $K_{ISC}/K_{RISC}$ of the emitting material is about 10, and the $K_{FL(original)}$ is about $2\times10^8$ reverse seconds (s$^{-1}$) or greater; or
   b) the $K_{ISC}/K_{RISC}$ of the emitting material is about 50, and the $K_{FL(original)}$ is about $6\times10^8$ reverse seconds (s$^{-1}$) or greater,
   wherein $\tau_{PH(effective)}$ of the emitting material is selected from a range of about $1\times10^{-8}$ seconds (s) to about $1\times10^{-7}$ seconds (s).

18. The light-emitting device of claim 1, wherein the emitting material comprises a third row transition metal.

19. The light-emitting device of claim 1, wherein the emitting material comprises iridium, platinum, osmium, rhenium, rhodium, palladium, nickel, magnesium, zinc, gadolinium, silver, copper, or cobalt.

20. The light-emitting device of claim 1, wherein the emitting material is an organic metal compound comprising a third row transition metal.

* * * * *